United States Patent [19]
Rammel et al.

[11] Patent Number: 5,291,068
[45] Date of Patent: Mar. 1, 1994

[54] TOUCH SENSITIVE SWITCHING APPARATUS

[75] Inventors: Thomas W. Rammel, Cokato; Terrence R. Arbouw, Howard Lake, both of Minn.

[73] Assignee: Sterner Lighting Systems Incorporated, Winsted, Minn.

[21] Appl. No.: 938,955

[22] Filed: Sep. 1, 1992

[51] Int. Cl.$^5$ .................................. H01H 35/00
[52] U.S. Cl. ................................ 307/116; 307/11; 200/512; 200/52 R
[58] Field of Search ............... 307/11, 31, 112, 113, 307/116, 125, 132 R, 139; 200/512, 600, 17 R, 52 R

[56] References Cited

U.S. PATENT DOCUMENTS

| | | | |
|---|---|---|---|
| 3,307,071 | 2/1967 | Diamond | 315/160 |
| 3,715,540 | 2/1973 | Larson | 200/502 |
| 3,737,670 | 6/1973 | Larson | 307/116 |
| 4,045,629 | 8/1977 | Anzani | 200/600 |
| 4,090,092 | 5/1978 | Serrano | 307/116 |
| 4,100,384 | 7/1978 | Nishioka | 200/160 |
| 4,237,421 | 12/1980 | Waldron | 307/116 |
| 4,246,533 | 1/1981 | Chiang | 307/116 |
| 4,380,040 | 4/1983 | Posset | 361/280 |
| 4,486,811 | 12/1984 | Kamiya et al. | 361/280 |
| 5,091,617 | 2/1992 | Yamamoto et al. | 200/144 AP |

OTHER PUBLICATIONS

Easter-Owens Electric Company pamphlet entitled "Touch Sensor Switch System" (date unknown); 6522 Fig St.; Arvada, Colo. 80004; (303)/431-0111.
Easter-Owens Electric Co. pamphlet entitled "Easter-Owens' Touch Bolt Switch System ELC" (Date Unknown); 6522 Fig St.; Arvada, Colo. 80004; (303) 431-0111.

Primary Examiner—Jeffrey A. Gaffin
Attorney, Agent, or Firm—Westman, Champlin & Kelly

[57] ABSTRACT

A touch sensitive switching apparatus for controlling the operation of an electrical load is disclosed. The apparatus includes a programmable controller and a touch sensor assembly. The controller is connected to the electrical load and is programmable to provide a repeatable sequence to operate the load wherein each step of the sequence is initiated by touching two contact surfaces of the touch sensor assembly. The controller can also be configured to duplicate a momentary switch wherein the load is energized as long as the contact surfaces of the touch sensor assembly are connected. The touch sensor assembly can be mounted in a wall panel. The assembly includes a conductive housing with a conductive rod positioned therein. A first fastener secures the rod within the housing, while a second fastener secures the assembly to the wall panel.

21 Claims, 4 Drawing Sheets

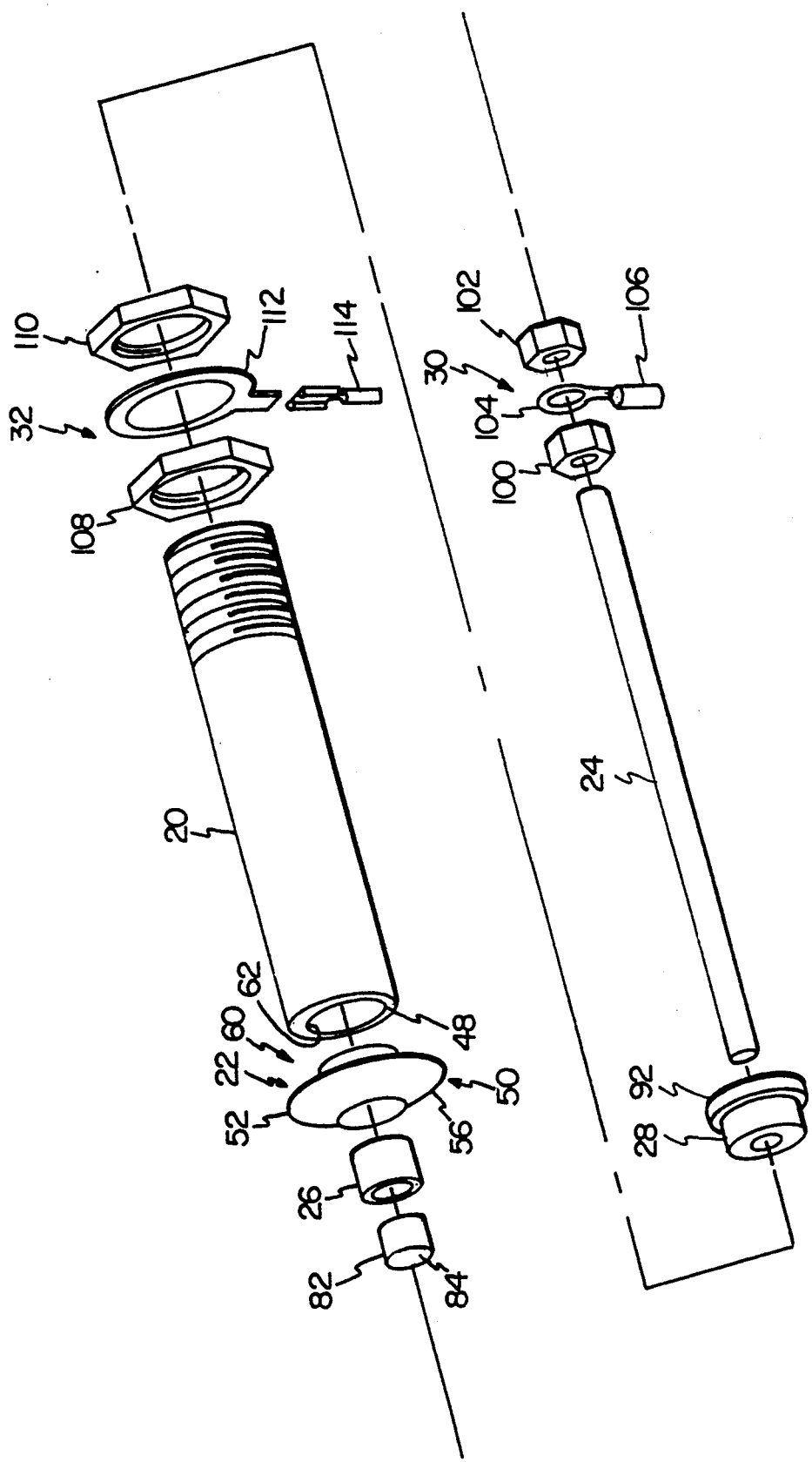

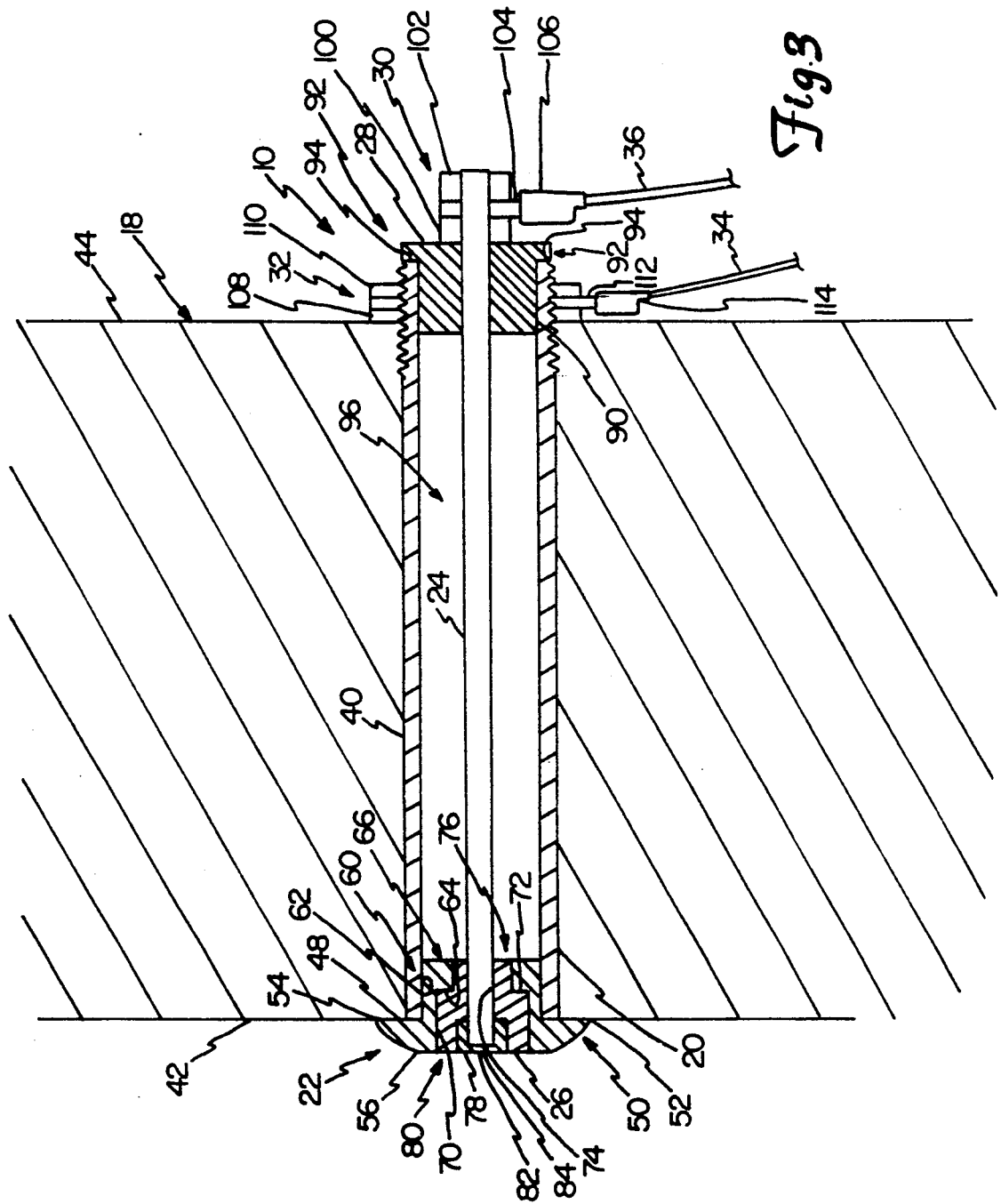

5,291,068

TOUCH SENSITIVE SWITCHING APPARATUS

BACKGROUND OF THE INVENTION

This invention relates to an electronic switching device. More particularly, the present invention provides a touch sensitive switching apparatus comprising a touch sensor assembly connected to a controller to provide programmed control of an electrical load.

Common electrical switches operate by bringing two conductors into physical contact to complete a circuit through which current can flow. However, due to this mechanical operation, the common electrical switch is subject to wear and eventual failure. Wear can originate from the repeated movement of engaging parts, for example, contact wear when one contact strikes the other contact. Wear also can be associated with the accumulation of dust or dirt present within the switch housing. Failure also can originate from physical abuse such as from vandalism.

To obviate the difficulties encountered with mechanical switches, touch sensitive switches, utilizing resistance bridging have been developed. The resistance bridging type of touch sensitive switch includes at least two electrodes. When a person touches the two electrodes, skin resistance across the electrodes is sensed by associated circuitry, which produces an output signal to energize the desired electrical load.

SUMMARY OF THE INVENTION

The present invention provides a touch sensitive switching apparatus comprising a circuit or controller connected to a touch assembly. The touch assembly includes two touch contact surfaces. The circuit is connected to an electrical load and controls the electrical load based on electrical connection of the first touch contact surface to the second contact surface.

In a first embodiment, the touch responsive apparatus includes a conductive housing having a first end portion and a second end portion, the first end portion includes the first contact surface and a stop member. A conductive longitudinal member having a longitudinal axis is disposed within the conductive housing and has a first member end having the second touch contact surface and a stop surface. An insulator for electrically insulating the conductive longitudinal member from the conductive housing is interposed between engaging the stop surface and the stop member. A fastener is connected to the conductive longitudinal member to secure the first member end against the insulator. The circuit means is connected to the conductive housing and the conductive longitudinal member. The circuit means responds to substantially non-infinite resistance connected between the first contact surface and the second contact surface to selectively control operation of the electrical load.

BRIEF DESCRIPTION OF THE DRAWINGS

FIG. 2 is an exploded view of a touch sensor assembly; and

FIG. 3 is a sectional view of the touch sensor assembly mounted in a wall.

DETAILED DESCRIPTION OF THE PREFERRED EMBODIMENTS

Figure 1A:
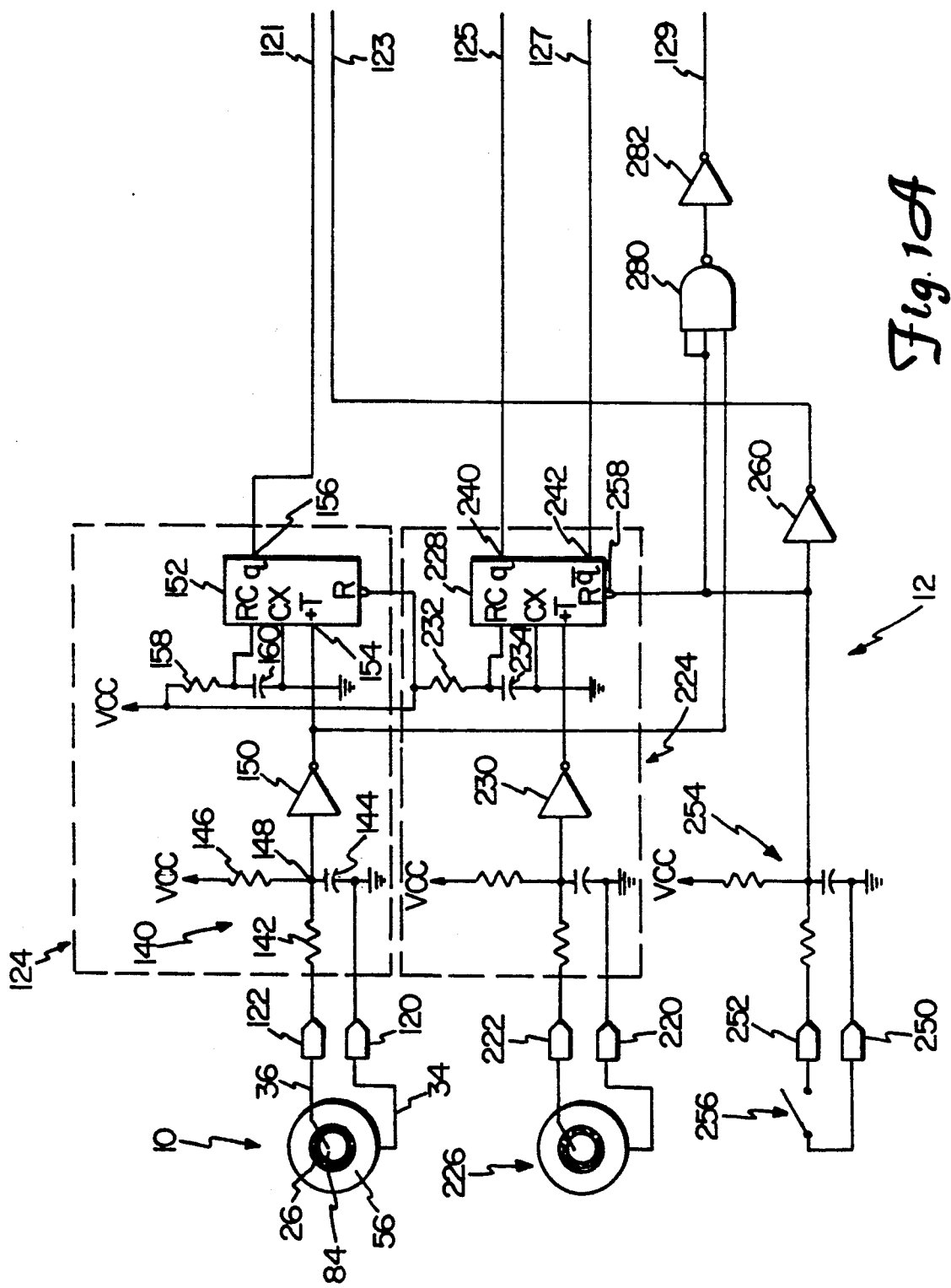
FIG. 1A is a schematic, block diagram of a portion of a touch sensitive switching apparatus of the present invention.
Figure 1B:
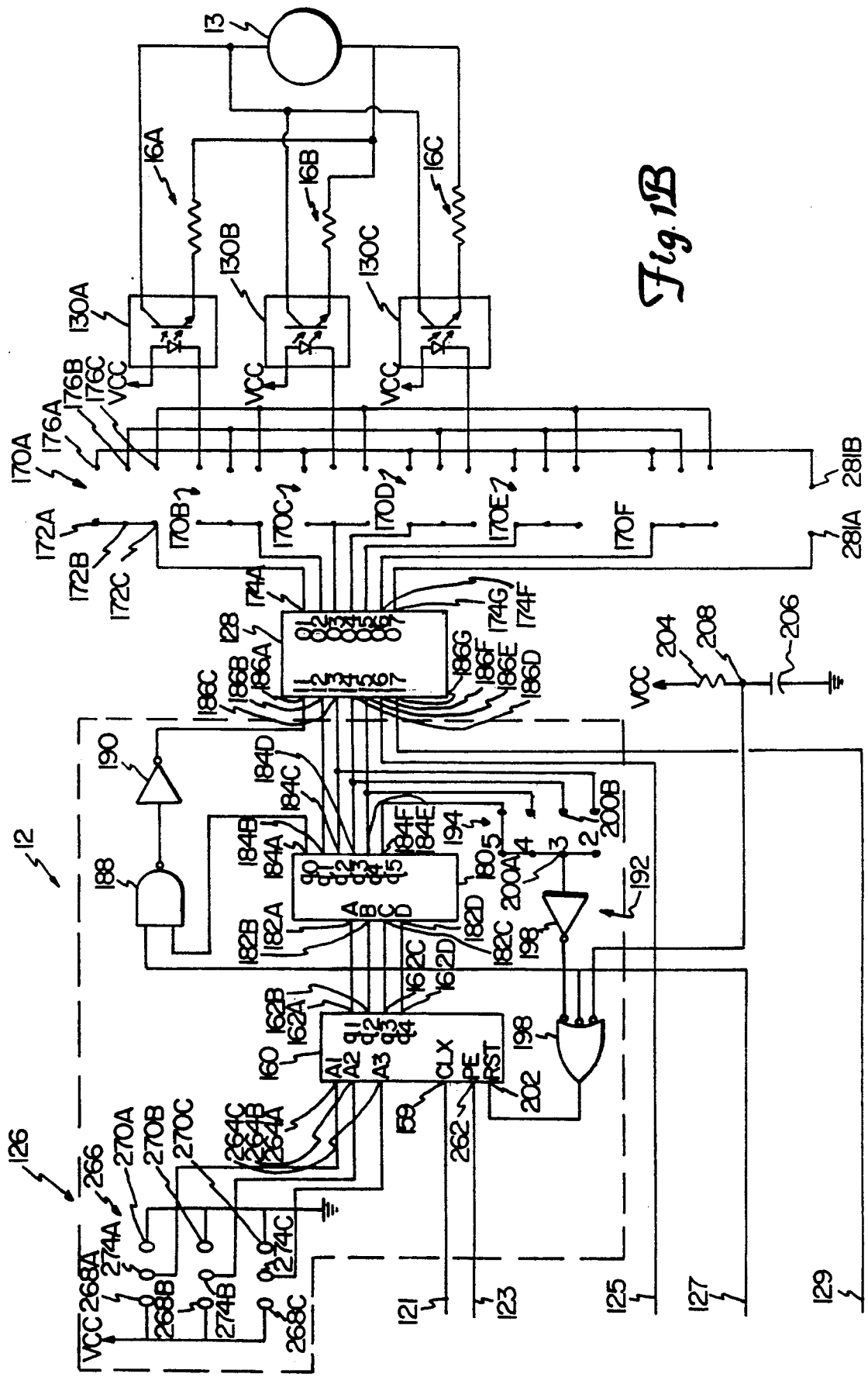
FIG. 1B is a schematic, block diagram of a portion of the touch sensitive switching apparatus of the present invention.

FIGS. 1A and 1B schematically illustrate a touch sensor assembly 10 (FIG. 1A) connected to a switching controller 12 (FIGS. 1A and 1B) that together form a touch sensitive switching apparatus of the present invention. The touch sensitive switching apparatus controls energization of a plurality of electrical loads 16A, 16B and 16C connected to a power supply 13 (FIG. 1B). The touch sensor assembly 10 serves as an input device to the controller 12. The controller 12 energizes the electrical loads 16A-16C in preselected combinations. The preselected combinations of loads comprise steps of a repeatable sequence, wherein each step is selected by repeatedly touching the touch sensor assembly 10.

Referring to FIGS. 2 and 3, the touch sensor assembly 10 is mounted within a wall 18. The touch sensor assembly 10 includes an electrically conductive housing 20, an electrically conductive end cap 22, an electrically conductive rod 24 disposed within the conductive housing 20 and insulators 26 and 28 to insulate electrically the conductive rod 24 from the conductive housing 20. Fasteners 30 and 32 connected to the conductive rod 24 and the conductive housing 20, respectively, secure the touch sensor assembly 10 together and to the wall 18. The fasteners 30 and 32 include leads 36 and 34, respectively, to connect the touch sensor assembly 10 to the controller 12.

As illustrated in FIG. 3, the conductive housing 20 is inserted into a suitable aperture 40 of the wall 18. The conductive housing 20 has sufficient length to extend generally from an outer surface 42 of the wall 18 to an inner surface 44 with an end of the housing 20 also extending past the inner surface 44.

The conductive end cap 22 is joined to a first end 48 of the conducting housing 20. An outer portion 50 of the end cap 22 is annular and has an outer edge 52 of diameter larger than either the conductive housing 20 or the aperture 40. The outer portion 50 has an inwardly facing surface 54 of suitable texture for engaging the outer surface 42 of the wall 18. Preferably, the outer portion 50 further includes a curved or partially domed surface 56 extending outwardly from the outer wall 42 and inwardly from the edge 52 toward the center of the end cap 22. The outer surface 56 serves as a first touch contact surface of the touch sensor assembly 10.

The end cap 22 further includes an inner portion 60. The inner portion 60 extends into the conductive housing 20 along an inner surface 62 to align the end cap 22 with the conductive housing 20. An annular flange 66 is connected to the inner portion 60 and has an outwardly facing surface 64. Preferably, the outer portion 50, inner portion 60 and annular flange 66 are integrally connected together to form a single unitary piece.

The end cap 22 has a cavity 70 defined by inner annular walls of the outer portion 50 and inner portion 60. The insulator 26 is disposed within the cavity 70 with a corresponding annular surface 72 engaging the outwardly facing surface 64 of the flange 66. The annular flange 66 serves as a means to stop or limit insertion of the insulator into the end cap 22. The insulator 26 includes an aperture 74 extending from an inner end 76 and longitudinally through the insulator 26, opening to a larger cavity 78 at an outer end 80.

The conductive rod member 24 is inserted within the conductive housing 20 to extend longitudinally along an axis of the housing 20 and through the aperture 74 and into the cavity 78 in the insulator 26. An end of the conductive rod member has outwardly facing threads which threadably mate with corresponding inwardly facing threads of an electrically conductive cap 82. The cap 82 is received in the cavity 80 of the insulator 26 thereby insulating the conductive cap 82 and conductive rod 24 from the conductive housing 20 at the outer end of the assembly. An end surface 84 of the cap 82 serves as a second touch contact surface for the touch sensor assembly 10.

The insulator 28 at the inner end of the conductive housing 20 further insulates the conductive rod 24 from the housing 20. The insulator 28 includes an aperture 90 through which the conductive rod 24 is disposed. The insulator 28 is inserted into the inner end of the conductive housing 20 where an extending flange 92 of the insulator 28 contacts an end surface 94 of the conductive housing 20 to limit inward movement. Together the insulators 26 and 28 sufficiently insulate the conductive rod 24 from the housing 20 and end cap 22; however, if further isolation is desired, additional insulators can be disposed within an inner chamber 96 of housing 20.

The insulator 28 further provides a loading surface for a hex nut 100. The hex nut 100 threadably mates on the end portion of the conductive rod 24. When sufficiently turned, the hex nut 100 tends to pull the conductive rod 24 out from the conductive housing 20. Since the conductive rod 24 is effectively attached to the end cap 22, through the inner annular flanges 66 of the insulator 26 and the end cap 22, tension created in the conductive rod 24 pulls the end cap 22 toward the conductive housing 20, while at the same time pushing the insulator 28 and conductive housing 20 toward the end cap 22. The hex nut 100 thus secures the touch sensor assembly 10 together. A second nut 102 secures the nut 100 in position and is used to clamp a ring terminal 104 to the conductive rod 24. A suitable connector 106 connects the lead 36 to the ring terminal 104.

The fastener 32 secures the touch sensor assembly 10 to the wall 18. The fastener 32 includes a nut 108 that threadably mates with threads on the outside surface of the conductive housing 20. When the nut 108 is sufficiently turned, longitudinal movement of the assembly 10 in aperture 40 is prevented. A second nut 110 also threaded onto the threaded portion of the conductive housing 20 secures the position of the nut 108 and is used to secure a ring terminal 112 to the conductive housing 20. A suitable connector 114 connects the lead 34 to the ring terminal 112.

The leads 34 and 36 from the touch sensor assembly 10 are connected to inputs 120 and 122, respectively, of the controller illustrated in FIG. 1A. Generally, the controller 12 includes a resistive sensing, filtering and debounce circuit indicated at 124, a programmable sequencing circuit indicated at 126 (FIG. 1B), a driver 128 (FIG. 1B) and an isolation circuit 130A, 130B and 130C (FIG. 1B) for each electrical load 16A, 16B and 16C. As illustrated, the circuit elements of FIGS. 1A and 1B are connected along signal lines 121, 123, 125, 127 and 129.

The controller 12 is used to control energization of the electrical loads 16A-16C in preselected combinations. Specifically, when a substantially non-infinite resistance is established between the first touch contact surface 56 and the second touch contact surface 84 of the touch sensor assembly 10, for example, when an operator's finger sufficiently contacts the end cap 22 and the conductive cap 82, the controller 12 turns on a preselected combination of the electrical loads 16A-16C. With repeated touching of the touch sensor assembly 10 in the manner described above, the operator can step the controller 12 through a repeatable sequence to obtain other desired combinations of loads 16A-16C.

The inputs 120 and 122 are connected to a suitable filtering network 140 to remove unwanted, possibly interfering electrical signal noise. In the embodiment illustrated, the filtering network 140 comprises a resistor 142 and a capacitor 144 connected in series. A resistor 146 connected to a node 148 between the resistor 142 and the capacitor 144, and connected at an opposite end to a circuit voltage source ("VCC"), forms a voltage divider with the resistor 142. When the operator touches the touch sensor assembly 10, the circuit from VCC to circuit ground is completed to provide an input voltage signal at node 148.

The node 148 from the filtering network 140 is connected to a Schmitt trigger inverter 150, which in turn is connected to a monostable multivibrator 152 at an input 154. When initiated from the Schmitt trigger inverter 150, with input hysteresis to provide further filtering, the monostable multivibrator 152 provides a one-shot pulse from an output 156 on the signal line 121. The pulse width is conventionally determined from the resistance and capacitance values of a resistor 158 and a capacitor 160, respectfully. In the preferred embodiment, the monostable multivibrator 152 is retriggerable. That is, if the monostable multivibrator 152 is triggered repeatedly while an output pulse is being generated at the output 156, the pulse Width or duration will then be extended.

The output pulse from the monostable multivibrator 152 on signal line 121 is provided as a clock input 159 to a counter 160 in FIG. 1B. The counter 160 is used as a sequencing device to provide a repeatable set of binary codes at its terminal outputs 162A, 162B, 162C and 162D that represent preselected combinations of the electrical loads. As illustrated in FIG. 1B, each electrical load 16A-16C is connected to the corresponding isolation drive circuit 130A-130C, such as a solid state relay, that in turn is connected to a plurality of terminal connections 170A, 170B, 170C, 170D and 170E. With reference to the set of terminal connections 170A, terminal points 172A, 172B and 172C are connected together and then to a single output 174A of the driver 128, while a terminal point 176A is connected to the isolation driver 130A for load 16A; the terminal point 176B is connected to the isolation driver 130B for load 16B; and a terminal point 176C is connected to the isolation driver 130C for load 16C. Each remaining set of terminal connections 170B-170E is similarly connected to the driver 128 at a single output and then to each of the isolation drives 130A-130C for each of the loads 16A-16C.

The set of terminal connections 170A-170E are used to preselect a desired combination of loads 16A-16C to be energized sequentially for each touch of the touch sensor assembly 10. As stated, the counter 160 provides a binary code at outputs 162A-162D that represent a repeatable sequence of load combinations. The first combination of loads is preselected by connecting a diode across the terminal points of the set of terminal connections corresponding to the desired load to be energized. For example, if it is desired that loads 16A and 16C be energized upon powering of the touch sensitive switching apparatus (the first step of the repeatable sequence), a diode would be connected between terminal points 172A and 176A (corresponding to the load 16A) and terminal points 172C and 176C (corresponding to the load 16C). In this example, a diode would not be connected between the terminal points 172B and 176B since it is not desired to have the load 16B energized for this portion of the sequence.

In the embodiment illustrated, the sequence of load energization comprises up to five steps with a combination of loads selected in a manner described above with the set of terminal connections 170A-170E for each step. As stated, the counter 160 provides a binary code at outputs 162A-162D representing each step in the sequence of steps. The outputs 162A-162D are connected to a decoder 180 at inputs 182A, 182B, 182C and 182D that in turn decodes each representative step binary code to initiate a single output from outputs 184A, 184B, 184C, 184D, 184E, and 184F corresponding to the binary code. The outputs 184A-184E are connected to corresponding inputs 186A, 186B, 186C, 186D, and 186E of the driver 128, the output 184A being connected to the input 186A through a NAND gate 188 and inverter 190. When each input of the driver 128 is initiated, the corresponding output for that input is activated to energize the loads.

A feedback path indicated generally at 192 in FIG. 1B, which generally includes a set of terminal connections indicated at 194, an inverter 196 and a NAND gate 198 is used to reset the sequence to the first step by resetting the counter 160. Specifically, placement of a jumper across an individual pair of terminal points in the set of terminal connections 194 selects the amount of steps in the sequence. For example, if it is desired that the number of steps in the sequence is to equal 3 before the first step is again repeated, a jumper would then be connected between terminal points 200A and 200B in the set of terminal connections 194. In this example, when an output signal is present at the output 184E of the decoder 180 to represent the fourth step of the sequence of steps, the signal is propagated through the terminal points 200A and 200B of the set of terminal connections 194, the inverter 196 and the NAND gate 198. An output signal from the NAND gate 198 is substantially instantaneously provided to an input 202 of the counter 160 to reset the counter 160 to the first step of the sequence of steps.

In addition, the controller 12 includes a power on reset that resets the counter 160 to the first step in the sequence. The power on reset circuit comprises a resistor 204 connected to the supply voltage and a capacitor 206 that is connected to circuit ground. The node 208 between the resistor 204 and the capacitor 206 is connected to an input of the NAND gate 198. The capacitor 206 opposes any sudden voltage increase at node 208. Thus, when power is supplied to the controller 12 from a voltage source, not shown, a signal representing a binary state "0" is momentarily present at node 208, which in turn is provided to the NAND gate 198. The output of the NAND gate 198 then resets the counter 160 to the binary code at outputs 184A-184F representative of the first step. The power on reset signal is removed when the node 208, through the charging of the capacitor 206, obtains a voltage representing a binary state "1".

The controller 12 further energizes the desired combination of loads 16A-16C for a finite period of time. Referring back to FIG. 1A, inputs 220 and 222 are connected to a filtering and debounce circuit 224 similar to the circuit 124. The inputs 220 and 222 are connected to a second touch sensor assembly 226 or other suitable switching device that when operated provides an input signal to a monostable multivibrator 228 through a Schmitt trigger inverter 230. The monostable multivibrator 228 is similar to the multivibrator 152 illustrated in the circuit 124 and provides a pulse width of selected duration as determined conventionally from a resistor 232 and a capacitor 234. The values of the resistor 232 and the capacitor 234 are chosen to provide a pulse width equal to the desired "on" time of the electrical loads 16A-16C.

When the monostable multivibrator 228 is initiated, a pulse signal representing a binary state "1" from an output 240 of the monostable multivibrator 228 is provided on signal line 125 to the driver 128 (FIG. 1B) at an input 186F. An output 174F of the driver 128, corresponding to the input 186F, is connected to a set of terminal connections 170F, which in turn, as in the manner described above, is connected with appropriate diodes to obtain the desired combination of loads 16A-16C to be energized for the selected "on" time.

Referring back to FIG. 1A, as the pulse signal representing a binary state "1" is provided at the output 240 of the monostable multivibrator 228, a pulse signal representing a binary state "0" is also provided at an output 242 and on signal line 127. As illustrated in FIG. 1B, the signal line 127 is connected to an input of the NAND gate 198 and to an input of the NAND gate 188. Thus, when the time delayed inputs are initiated, the counter 160 is reset to the first step of the sequence. However, the load combination representative of the first step is not energized until the delay energization of the loads is complete. Specifically, the NAND gate 188 will not provide an input signal to the inverter 190 until the time delay energization period is complete as indicated by a binary state "1" present on signal line 127. At that time, the loads 16A-16C are then energized as selected by the first step of the sequence of steps.

Referring to FIG. 1A, a disable feature is further provided in the controller 12 as initiated through inputs 250 and 252. The inputs 250 and 252 are connected to a filtering network 254 similar to that shown in the circuits 124 and 224. When electrically connected together, such as through a security key switch, a toggle switch, or other similar device 256, a signal representing a binary state "0" resets the monostable multivibrator 228 at a reset input 258. The disable signal is further provided to an inverter 260, an output terminal of which is connected to signal line 123 and provides a signal to the counter 160 at a preset input 262 of FIG. 1B. An initiation signal at the preset input 262 loads the counter 160 with a binary code representative of one of the preselected combination of the loads 16A-16C as determined by a corresponding set of jumper connections 266.

The set of jumper connections 266 includes terminal points 268A, 268B and 268C connected to a reference supply voltage that represents a binary "1" state and terminal points 270A, 270B and 270C connected to circuit ground that represents a binary "0" state. Terminal points 274A, 274B and 274C are connected to either the terminal points 268A-268C or the terminal points 270A-270C to provide a binary code corresponding to one of the set of terminal connections 170A-170E. Thus, when the disable inputs 250 and 252 are initiated, the time delay function of the controller 12 is disabled through monostable multivibrator 228 and the touch sequence is disabled through counter 160. In addition, if the jumper connections 266 are used, the controller 12 can energize loads 16A-16C in any combination selected by terminal connections 170A-170F.

The disable signal is further provided to an input of a NAND gate 280. An output of the NAND 280 gate is connected to an inverter 282, which in turn is connected to the signal line 129 and to an input 186 of the driver 128.

As an alternative to a repeatable sequence, the controller can energize loads as long as inputs 120 and 122 are electrically connected, and thus, duplicate a momentary switch. As illustrated in FIG. 1A, the output of the Schmitt trigger inverter 150 is connected to an input of a NAND gate 280. An output of the NAND gate 280 is connected to an inverter 282 which in turn is connected to the signal line 129 and to an input 186G of the driver 128. An output 174G of the driver 128 is connected to a terminal point 281A. A complementary terminal point 281B is connected to the isolation driver 130A. To configure the controller 12 to duplicate a momentary switch, a diode is connected between terminal points 281A and 281B. Therefore, when the first contact surface 56 is electrically connected to the second contact surface 84 through, for example, an operator's finger bridging the surfaces, the controller 12 will initiate isolation drivers connected to the terminal point 281B. The isolation drivers in turn will cause energization of the load, which will remain energized until the electrical connections between the contact surfaces 56 and 84 is broken.

It should be understood that since the repeatable sequence of load combinations is not desired, no diodes are present in the set of terminal connections 170A-170E. However, if a time delay function is desired, diodes would be used in the set of terminal connections 170F. Furthermore, since the disable signal is also provided to the NAND gate 280, the loads can follow operation of the disable switch 256 when a diode is connected between terminal points 281A and 281B.

In a preferred embodiment, the monostable multivibrators 152,228 are of type 4538BE manufactured by Harris Corp., Melbourne, Fla.; the Schmitt trigger inverters 150,230,260,282,190,196 are of type 74C14 manufactured by National Semiconductor Corp., Santa Clara, Calif.; the NAND gates 280,198,188 are of type 4023BE manufactured by Harris Corp., Melbourne, Fla.; the counter 160 is of type 4510B manufactured by Panasonic Co., Arlington Heights, Ill.; the decoder 180 is of type 4028B manufactured by Panasonic Co., Arlington Heights, Ill.; and the driver 128 is of type ULN 2804 manufactured by Sprague Electric Co., Lexington, Mass.; and the isolation drivers 130 are of type CX240D5R manufactured by Crydon Div., International Rectifier Corp, El Segundo, Calif. In addition, the resistor 232 has a value of one hundred kilo ohms and the capacitor 234 has a value of two hundred and twenty micro farads, which provides a time delay function of approximately 10 seconds.

In summary, the present invention provides a versatile controller. The controller can be configured to provide a repeatable sequence of load combinations, or duplicate a momentary switch. In addition, the controller can energize the loads for a preselected time duration as well as disable all operation, if desired.

The controller can be connected to one or more touch sensitive assemblies. The assembly includes two touch contact surfaces concentrically arranged to provide ease of use. The assembly is easily mounted within a wall to provide a virtually indestructible, durable wall switch.

Although the present invention has been described with reference to preferred embodiments, workers skilled in the art will recognize that changes may be made in form and detail without departing from the spirit and scope of the invention.

What is claimed is:

1. A touch responsive apparatus for use in controlling an electrical load, the apparatus comprising:
   conductive housing means having a first housing end and a second housing end, wherein the first housing end includes a first touch contact surface and stop means;
   a conductive longitudinal member having a longitudinal axis disposed within the conductive housing means and a first member end having a second touch contact surface and a stop surface;
   insulation means for substantially electrically insulating the conductive longitudinal member from the conductive housing means, the insulation means interposed between and engaging the stop surface and the stop means;
   fastening means connected to the conductive longitudinal member to secure the first member end against the insulation means; and
   circuit means electrically connected to the conductive housing means and the conductive longitudinal member, the circuit means responsive to substantially non-infinite resistance connected between the first contact surface and the second contact surface to selectively control operation of the electrical load.

2. The touch responsive apparatus as specified in claim 1 wherein the stop means is disposed within the conductive housing means.

3. The touch responsive apparatus as specified in claim 2 wherein the stop means comprises an inner flange.

4. The touch responsive apparatus as specified in claim 1 wherein the first touch contact surface is curved.

5. The touch responsive apparatus as specified in claim 4 wherein the first touch contact surface is curved outwardly from the first housing end.

6. The touch responsive apparatus as specified in claim 1 wherein the first housing end includes a detachable end cap.

7. The touch responsive apparatus as specified in claim 1 wherein the conductive longitudinal member includes a threaded portion, and the fastening means comprises a threaded member mating with the threaded portion.

8. The touch responsive apparatus as specified in claim 7 wherein the conductive longitudinal member comprises a rod having outwardly facing threads, and the threaded member comprises a nut having inwardly facing threads that mate with the outwardly facing threads.

9. The touch responsive apparatus as specified in claim 1 wherein the conductive housing means is disposed in an aperture of a panel, the first housing end having a flange portion to engage an outer surface of the panel substantially adjacent the aperture, and a second fastening means connected to the second housing end to engage a second outer surface of the panel.

10. The touch responsive apparatus as specified in claim 9 wherein the second housing end extends beyond the second outer surface of the panel and includes a threaded portion, and wherein the second fastening means comprises a second threaded member threadably mating with the threaded portion of the second housing end.

11. The touch responsive apparatus as specified in claim 10 wherein the second housing end includes outwardly facing threads and the second threaded member comprises a second nut.

12. The touch responsive apparatus as specified in claim 1 wherein the circuit means includes program means providing a sequence of repeatable steps to control operation of the electrical load, wherein each step represents a function of operation of the electrical load.

13. The touch responsive apparatus as specified in claim 12 wherein each step of the sequence of repeatable steps is sequenced from a previous step by substantially non-infinite resistance connected between the first contact surface and the second contact surface.

14. The touch responsive apparatus as specified in claim 12 wherein the electrical load comprises a plurality of electrical loads and each function of operation comprises a combination of the electrical loads to be energized, and wherein the circuit means includes means for selecting combinations of electrical loads for each step of the sequence of repeatable steps.

15. The touch responsive apparatus as specified in claim 12 wherein the circuit means includes means for selecting the number of steps in the sequence of repeatable steps is selectable.

16. The touch responsive apparatus as specified in claim 1 wherein the circuit means includes time delay means to operate the electrical load for a desired time period.

17. The touch responsive apparatus as specified in claim 1 wherein the circuit means includes disable means to selectively prevent operation of the electrical load.

18. A touch responsive apparatus for use in controlling an electrical load, the apparatus mounted within an aperture of a panel, the apparatus comprising:
   a conductive housing having a first end portion and a second end portion, the first end portion having an inner flange, an outer flange and a first touch contact surface, the conductive housing disposed within the aperture wherein the outer flange engages an outer surface of the panel;
   a conductive threaded rod disposed within the conductive housing, the threaded rod having a second touch contact surface and a stop surface;
   insulation means for substantially electrically insulating the conductive threaded rod from the conductive housing, the insulation means interposed between the inner flange and the stop surface;
   a fastening nut connected to the threaded rod to secure the stop surface against the insulation means;
   fastening means connected to the second housing end to secure the outer flange against the outer surface of the panel; and
   circuit means electrically connected to the conductive housing and the threaded rod, the circuit means responsive to substantially non-infinite resistance connected between the first contact surface and the second contact surface to selectively control operation of the electrical load.

19. The touch responsive apparatus as specified in claim 18 wherein the first end portion comprises a detachable end cap.

20. The touch responsive apparatus as specified in claim 19 wherein the second housing end portion extends beyond an outer surface of the panel and includes a threaded portion, and wherein the fastening means comprises a threaded member threadably mating with the threaded portion of the second housing end portion.

21. The touch responsive apparatus as specified in claim 20 wherein the second housing end portion includes outwardly facing threads and the threaded member comprises a second fastening nut.

* * * * *

UNITED STATES PATENT AND TRADEMARK OFFICE
CERTIFICATE OF CORRECTION

Page 1 of 2

PATENT NO. : 5,291,068
DATED : March 1, 1994
INVENTOR(S) : Thomas W. Rammel, et. al.

It is certified that error appears in the above-indentified patent and that said Letters Patent is hereby corrected as shown below:

In the Drawings:

Cancel Fig. 1B and insert Fig. 1B as shown on attached sheet.

Signed and Sealed this

Ninth Day of August, 1994

Attest:

BRUCE LEHMAN

Attesting Officer

Commissioner of Patents and Trademarks

UNITED STATES PATENT AND TRADEMARK OFFICE
CERTIFICATE OF CORRECTION

Page 2 of 2

PATENT NO. : 5,291,068
DATED : March 1, 1994
INVENTOR(S) : Thomas W. Rammel and Terrence R. Arbouw It is certified that error appears in the above-indentified patent and that said Letters Patent is hereby corrected as shown below:

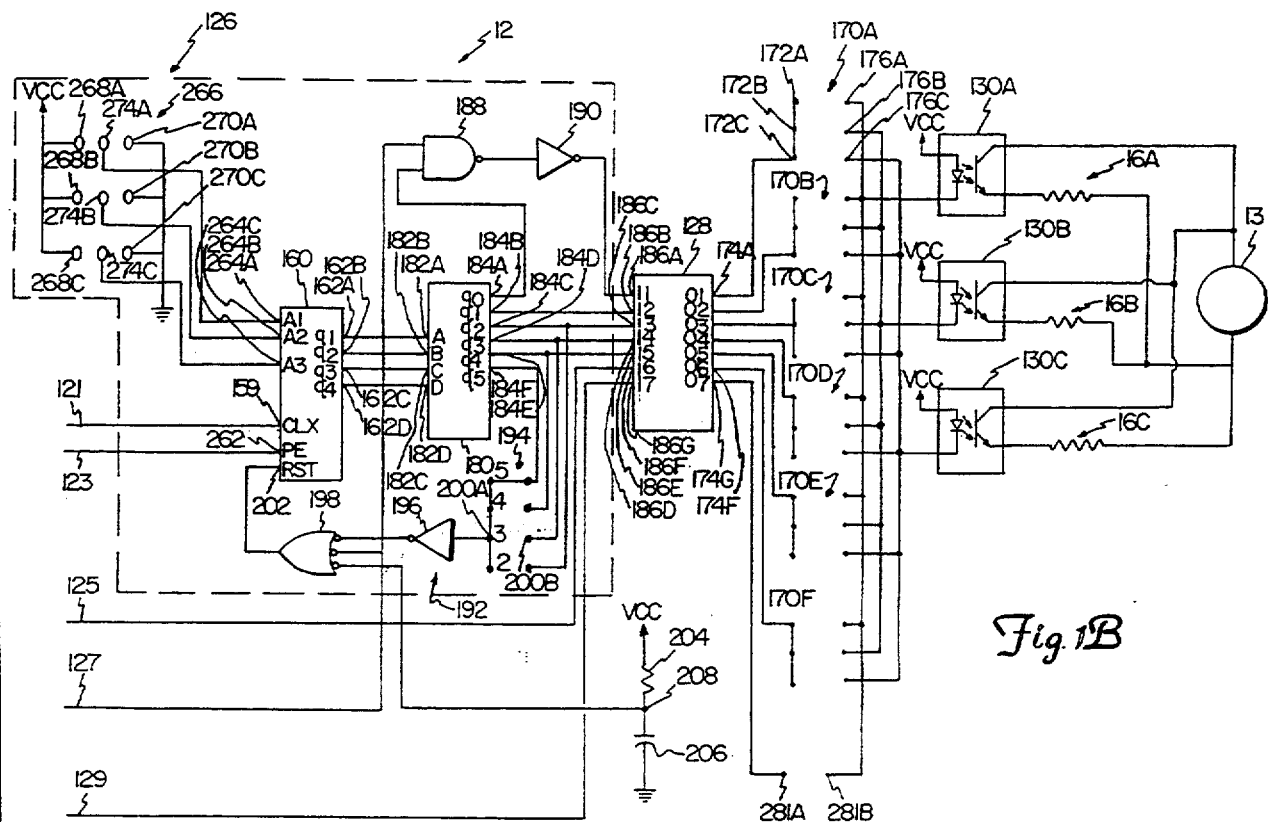

Fig. 1B